United States Patent
Adusumilli et al.

(10) Patent No.: US 10,115,665 B2
(45) Date of Patent: Oct. 30, 2018

(54) SEMICONDUCTOR RESISTOR STRUCTURES EMBEDDED IN A MIDDLE-OF-THE-LINE (MOL) DIELECTRIC

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/793,631

(22) Filed: Oct. 25, 2017

(65) Prior Publication Data
US 2018/0047668 A1 Feb. 15, 2018

Related U.S. Application Data

(62) Division of application No. 15/222,584, filed on Jul. 28, 2016, now Pat. No. 9,824,967.

(51) Int. Cl.
| | |
|---|---|
| *H01L 23/522* | (2006.01) |
| *H01L 49/02* | (2006.01) |
| *H01L 21/768* | (2006.01) |
| *H01L 23/535* | (2006.01) |
| *H01L 23/532* | (2006.01) |

(52) U.S. Cl.
CPC .... *H01L 23/5228* (2013.01); *H01L 21/76895* (2013.01); *H01L 23/535* (2013.01); *H01L 23/5329* (2013.01); *H01L 28/20* (2013.01)

(58) Field of Classification Search
CPC ............ H01L 27/0288; H01L 27/0629; H01L 27/0694; H01L 27/0688; H01L 27/0682; H01L 27/0676; H01L 27/067; H01L 27/0727; H01L 27/0722; H01L 27/0716; H01L 27/0711
See application file for complete search history.

(56) References Cited

U.S. PATENT DOCUMENTS

| | | |
|---|---|---|
| 5,485,138 A | 1/1996 | Morris |
| 6,037,623 A | 3/2000 | Spinner, III |
| 6,083,785 A | 7/2000 | Segawa et al. |
| 6,207,560 B1 | 3/2001 | Lee |
| 6,232,042 B1 | 5/2001 | Dunn et al. |

(Continued)

OTHER PUBLICATIONS

List of IBM Patents or Patent Applications Treated As Related dated Oct. 25, 2017, 2 pages.

*Primary Examiner* — Edward Chin
(74) *Attorney, Agent, or Firm* — Scully, Scott, Murphy & Presser, P.C.; Daniel P. Morris, Esq.

(57) ABSTRACT

A resistor structure composed of a metal liner is embedded within a MOL dielectric material and is located, at least in part, on a surface of a doped semiconductor material structure. The resistor structure is located on a same interconnect level of the semiconductor structure as a lower contact structure and both structures are embedded within the same MOL dielectric material. The metal liner that provides the resistor structure is composed of a metal or metal alloy having a higher resistivity than a metal or metal alloy that provides the contact metal of the lower contact structure.

18 Claims, 4 Drawing Sheets

(56) References Cited

U.S. PATENT DOCUMENTS

| | | |
|---|---|---|
| 7,375,000 B2 | 5/2008 | Nowak et al. |
| 7,560,761 B2 | 7/2009 | Cheng et al. |
| 8,110,862 B2 | 2/2012 | Cheng et al. |
| 8,111,129 B2 | 2/2012 | Hakey et al. |
| 8,921,199 B1 | 12/2014 | Erickson et al. |
| 9,570,571 B1 * | 2/2017 | Basker .................. H01L 29/435 |
| 2004/0027234 A1 | 2/2004 | Hasimoto et al. |
| 2015/0270156 A1 * | 9/2015 | Lin ....................... H01L 21/743 257/622 |
| 2017/0140993 A1 * | 5/2017 | Basker ............ H01L 21/823431 |
| 2017/0141102 A1 * | 5/2017 | Basker ................ H01L 27/0629 |

\* cited by examiner

SEMICONDUCTOR RESISTOR STRUCTURES EMBEDDED IN A MIDDLE-OF-THE-LINE (MOL) DIELECTRIC

BACKGROUND

The present application relates to a semiconductor structure and a method of forming the same. More particularly, the present application relates to a semiconductor structure including at least one resistor structure embedded in a middle-of-the-line (MOL) dielectric material. The present application also relates to a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

In semiconductor devices, it is well known to have a thin film resistor embedded in the chip through either a damascene approach or a subtractive etch method. For example, and during back-end-of-the-line (BEOL) processing, a thin film resistor may be embedded in a MOL dielectric material. Prior art methods of forming thin film resistors embedded in a MOL dielectric material are complicated and expensive. Moreover, topography issues arise when embedding a thin film resistor in a MOL dielectric material which may degrade the final chip yield. Other issues with prior art methods of embedding a thin film metal resistor in a MOL dielectric material include variation of sheet resistivity and tuning precision.

As such, there is a need for providing a semiconductor structure that includes a resistor structure embedded in a MOL dielectric material that can circumvent some of problems mentioned above, while providing design flexibility.

SUMMARY

A resistor structure composed of a metal liner is embedded within a MOL dielectric material and is located, at least in part, on a surface of a doped semiconductor material structure. The resistor structure is located on a same interconnect level of the semiconductor structure as a lower contact structure and both structures are embedded within the same MOL dielectric material. The metal liner that provides the resistor structure is composed of a metal or metal alloy having a higher resistivity than a metal or metal alloy that provides the contact metal of the lower contact structure.

In one aspect of the present application, a semiconductor structure is provided. In one embodiment of the present application, the semiconductor structure may include a substrate having a first doped semiconductor material structure present in a first device region, and a second doped semiconductor material structure present in a second device region. A middle-of-the-line (MOL) dielectric material is located on the substrate and surrounding the first and second doped semiconductor material structures. A lower contact structure is embedded in a first portion of the MOL dielectric material and contacts a surface of the first doped semiconductor material structure, and a resistor structure is embedded in a second portion of the MOL dielectric material and contacts a surface of the second doped semiconductor material structure. A next level dielectric material is located above the lower contact structure and the resistor structure. The next level dielectric material contains an upper contact structure in both the first and second device regions.

In another aspect of the present application, a method of forming a semiconductor structure is provided. In one embodiment of the present application, the method may include providing a substrate having a first doped semiconductor material structure present in a first device region, and a second doped semiconductor material structure present in a second device region, wherein a middle-of-the-line (MOL) dielectric material is located on the substrate and surrounds the first and second doped semiconductor material structures, and wherein the MOL dielectric material contains a lower contact structure containing a metal liner and a contact metal in both the first and second device regions. Next, a hard mask is formed atop the MOL dielectric material and the lower contact structure present in the first device region. At least a portion of the contact metal of the lower contact structure present in the second device region is then removed to expose at least a portion of the metal liner in the second device region. A next level dielectric material is then formed located above the lower contact structure present in the first device region and between and above the metal liner present in the second device region, wherein the next level dielectric material contains an upper contact structure in both of the first and second device regions.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
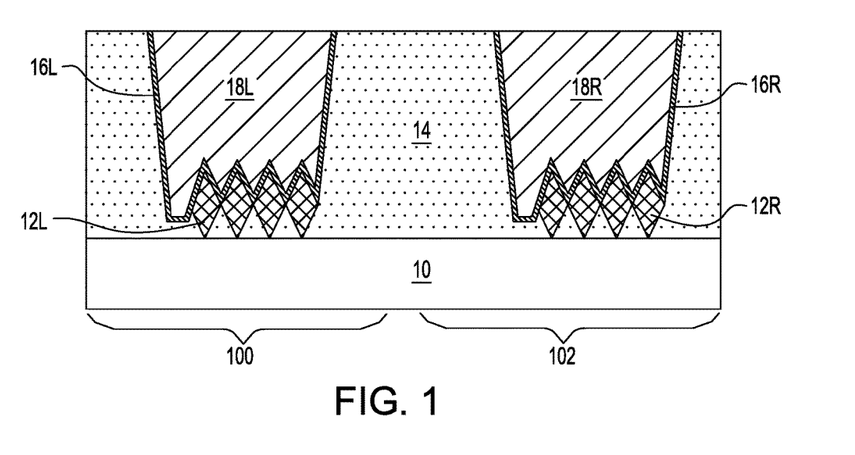
FIG. 1 is a cross sectional view of an exemplary semiconductor structure within one of a source region or a drain region and including a substrate having a first doped semiconductor material structure present in a first device region, and a second doped semiconductor material structure present in a second device region, and a lower contact structure containing a metal liner and a contact metal embedded in a MOL dielectric material and present in each of the first and second device regions in accordance with an embodiment of the present application.

Referring first to FIG. 1, there is illustrated an exemplary semiconductor structure that can be employed in accordance with an embodiment of the present application. In FIG. 1, and the remaining drawing figures, the cross sectional view is through one of the source region or the drain region. It is noted that the source region and the drain region would have identical structures located therein, and as such, there is no need to include separate views illustrating both regions. As is known in the art, the source region and drain region are located on opposite sides of a gate region. So as not to obscure the present application, the gate region is not shown in any of the drawing figures of the present application, however, one skilled in the art would readily understand that the gate region is present over a channel region and that the channel region is located between the source region and the drain region.

With respect to FIG. 1, the exemplary semiconductor structure includes a substrate 10 having a first doped semiconductor material structure 12L present in a first device region 100, and a second doped semiconductor material structure 12R present in a second device region 102. In the present application, the first device region 100 is an area in which a conventional metal contact would be formed contacting the first doped semiconductor material structure 12L, while the second device region 102 is an area in which a resistor structure will be subsequently formed.

The exemplary semiconductor structure shown in FIG. 1 also includes a lower contact structure containing a metal liner and a contact metal embedded in a MOL dielectric material 14 and present in each of the first and second device regions (100, 102). In the present application, a first lower contact structure (16L, 18L) containing a metal liner 16L and a contact metal 18L is present in a first contact opening that is formed in the MOL dielectric material 14 and in the first device region 100. As is shown, the first lower contact structure (16L, 18L) contacts a surface of the underlying first doped semiconductor structure 12L. A second lower contact structure (16R, 18R) containing a metal liner 16R and a contact metal 18R is present in a second contact opening that is formed in the MOL dielectric material 14 and in the second device region 102. As is shown, the second lower contact structure (16R, 18R) contacts a surface of the underlying second doped semiconductor structure 12R and is coplanar with the first lower contact structure (16L, 18L). Hence, the first and second lower contact structures are located in the same dielectric material level of the exemplary semiconductor structure.

The exemplary semiconductor structure that is shown in FIG. 1 may be formed utilizing any gate-first process or gate-last process that is well known in the art. In some embodiments and in either the gate-first process or the gate-last process, semiconductor fins may be formed by processing an upper semiconductor material portion of a bulk semiconductor substrate (to be described in more detail herein below) or a topmost semiconductor material layer of a semiconductor-on-insulator (SOI) substrate. The semiconductor fins can be formed utilizing a patterning process such as, for example, lithography and etching, or a sidewall image transfer (SIT) process. The term "semiconductor fin" denotes a contiguous semiconductor structure that extends upward from a surface of a substrate (such as substrate 10) and has a pair of vertical sidewalls that are parallel to each other. As used herein, a surface is "vertical" if there exists a vertical plane from which the surface does not deviate by more than three times the root mean square roughness of the surface. The height and width of the semiconductor fins can vary.

In some embodiments of the present application, the substrate 10 may be a semiconductor material portion of a bulk semiconductor substrate. The term "semiconductor material" denotes any material that has semiconducting properties. Illustrative examples of semiconductor materials that can be used in the present application include, for example, silicon (Si), germanium (Ge), silicon germanium alloys (SiGe), III-V compound semiconductors and/or II-VI compound semiconductors. III-V compound semiconductors include at least one element from Group III (i.e., Group 13) of the Periodic Table of Elements and at least one element from Group V (i.e., Group 15) of the Periodic Table of Elements, while II-VI compound semiconductors include at least one element from Group II (i.e., Group 2) of the Periodic Table of Elements and at least one element from Group VI (i.e., Group 16) of the Periodic Table of Elements). In one example, the substrate 10 may be composed of single crystal silicon.

In other embodiments of the present application, the substrate 10 may be composed of an insulator material which may be part of a SOI substrate. The insulator material that may provide the substrate 10 may be composed of crystalline or non-crystalline oxide or nitride. In one example, the insulator material that may provide the substrate 10 may be composed of silicon dioxide. In embodiments in which the insulator material is part of an SOI substrate, a handle substrate (not shown) may be located beneath the insulator layer. When present, the handle substrate may be composed of a semiconductor material (as defined above), an insulator material and/or a conductive material. When an SOI is employed, the SOI substrate can be formed utilizing any conventional technique including, for example, wafer bonding or SIMOX (Separation by Ion Implantation of Oxygen).

At least one gate structure (not shown) can be formed over a portion of the substrate 10. When semiconductor fins are formed, the at least one gate structure straddles over a portion of each of the semiconductor fins. The at least one gate structure may be a functional gate structure or a sacrificial gate structure which is subsequently replaced with a functional gate structure after forming the source regions and the drain regions. The term "functional gate structure" is used throughout the present application as a permanent gate structure used to control output current (i.e., flow of carriers in the channel) of a semiconducting device through electrical or magnetic fields. The functional gate structure typically includes a gate stack of a gate dielectric material and a gate conductor. The term "sacrificial gate structure" denotes a material or material stack that serves as a placeholder for a functional gate structure.

The first and second doped semiconductor material structures (12L, 12R) can then be formed from exposed semiconductor surfaces such as, for example, semiconductor fins, that are not protected by a gate structure and are within the source region and the drain region of the structure. The first and second doped semiconductor material structures (12L, 12R) may, in some embodiments, be composed of a plurality of doped subunits. In unit other embodiments, the first and second doped semiconductor materials structures (12L, 12R) can be composed of a single doped subunit. The first and second doped semiconductor material structures (12L, 12R) may be formed utilizing an epitaxial growth or deposition process. In the embodiment illustrated in the present application, the first and second doped semiconductor material structures (12L, 12R) are formed from exposed surfaces of each semiconductor fin; within the drawing figures the fins are covered by the first and second doped semiconductor material structures (12L, 12R).

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming first and second doped semiconductor material structures (12L, 12R) may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of the first and second doped semiconductor material structures (12L, 12R). In some embodiments, the source gas for the deposition of the first and second doped semiconductor material structures (12L, 12R) may include a silicon containing gas source or a mixture of a silicon containing gas source and a germanium containing gas source. Carrier gases like hydrogen, nitrogen, helium and argon can be used.

The first and second doped semiconductor material structures (12L, 12R) include a semiconductor material and an n-type dopant or a p-type dopant; the dopant may be added during the epitaxial growth process or after utilizing one of gas phase doping or ion implantation. The semiconductor material that provides the first and second doped semiconductor material structures (12L, 12R) may include one of the semiconductor materials mentioned above for substrate 10. The semiconductor material that provides the first and second doped semiconductor material structures (12L, 12R) may be the same as, or different from, the semiconductor material that provides either the substrate 10 or the semiconductor fins. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopants used in providing the first and second doped semiconductor material structures (12L, 12R) can range from 5e18 atoms/cm$^3$ to 1.5e21 atoms/cm$^3$.

In some embodiments in which semiconductor fins are formed, the first and second doped semiconductor material structures (12L, 12R) can be merged. In yet other embodiments and when semiconductor fins are formed, the first and second doped semiconductor material structures 12L may be unmerged. The first and second doped semiconductor material structures (12L, 12R) may, in some embodiments, have any shape including, for example, diamond shaped or rectangular shaped. The first and second doped semiconductor material structures (12L, 12R) may, in other embodiments, have an entirely planar topmost surface, or a corrugated surface such as is the case in the embodiment illustrated in FIG. 1.

At this point of the present application, a middle-of-the-line (MOL) dielectric material 14 can be formed. The MOL dielectric material 14 covers the first and second doped semiconductor structures (12L, 12R) and has a topmost surface that is typically coplanar with a topmost surface of the gate structure. After MOL dielectric material 14 formation, any sacrificial gate structure may be replaced by a functional gate structure utilizing techniques well known to those skilled in the art. The MOL dielectric material 14 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 14. The use of a self-planarizing dielectric material as MOL dielectric material 14 may avoid the need to perform a subsequent planarizing step.

In one embodiment, the MOL dielectric material 14 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the MOL dielectric material 14. The thickness of the MOL dielectric material 14 that can be employed in the present application may vary depending on the type of dielectric material employed as well as the method that was employed in forming the same. In one embodiment, the MOL dielectric material 14 has a thickness from 80 nm to 500 nm. Other thicknesses that are greater or lesser than the range provided above can also be used for the MOL dielectric material 14.

Next, contact openings (not shown) are formed into the MOL dielectric material 14 in each of the first and second device regions (100, 102) utilizing conventional techniques such as, for example, lithography and etching. The contact opening in the first device region 100 exposes a surface of the first doped semiconductor material structure 12L, while the contact opening in the second device region 102 exposes a surface of the second doped semiconductor material structure 12R.

The lower contact structures are then formed into each contact opening. Notably, a first lower contact structure containing a metal liner 16L and a contact metal 18L is formed in the first contact opening, while a second lower contact structure containing a metal liner 16R and a contract metal 18R is formed in the second contact opening. The lower contact structures are formed by first depositing a contiguous layer of a metal liner and a layer of a contact metal, and thereafter a planarization process is used to remove the portions of the layer of metal liner and the layer of contact metal that are present on the topmost surface of the MOL dielectric and outside the first and second contact openings.

The metal liners (16L, 16R) are composed of a metal alloy or metal alloy that has a higher resistivity than a metal or metal alloy that provides each contact metal (18L, 18R) of the lower contact structure. In one embodiment of the present application, the metal liners (16L, 16R) may be composed of titanium nitride (TiN), titanium (Ti), tantalum nitride (TaN), tantalum (Ta), tungsten (W), or tungsten nitride (WN). The contact metals (18L, 18R) may be composed of W, cobalt (Co), aluminum (Al), copper (Cu) or any alloys thereof such as, for example, an aluminum-copper alloy or a copper-aluminum alloy.

As is shown in FIG. 1, the metal liners (16L, 16R) line the entirety of each contact opening that is formed into the MOL dielectric material 14. Thus, a portion of the metal liner 16L directly contacts a surface of the first doped semiconductor material structure 12L, while other portions of the metal liner 16L contact portions of the MOL dielectric material 14. Likewise, a portion of the metal liner 16R directly contacts a surface of the second doped semiconductor material structure 12R, while other portions of the metal liner 16R contact portions of the MOL dielectric material 14. The lower contact structures have a topmost surface that is coplanar with the topmost surface of the MOL dielectric material 14.

Figure 2:
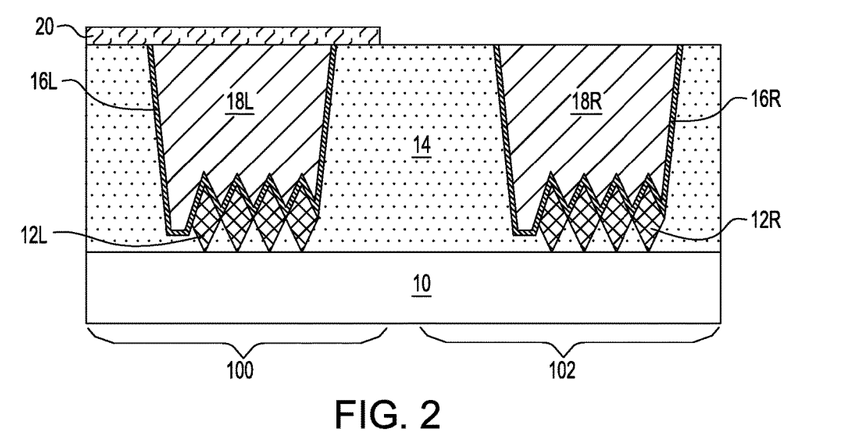
FIG. 2 is a cross sectional view of the exemplary semiconductor structure of FIG. 1 after forming a hard mask over the first device region, while leaving the second device region exposed for further processing.

Referring now to FIG. 2, there is illustrated the exemplary semiconductor structure of FIG. 1 after forming a hard mask 20 over the first device region 100, while leaving the second device region 102 exposed for further processing. Notably, the hard mask 20 is formed on at least the entire topmost surface of the lower contact (16L, 18L) formed in the first device region 100; a portion of the hard mask 20 may extend onto the topmost surface of the MOL dielectric material 14 in the first device region 100.

The hard mask 20 may be formed by first forming a blanket layer of a hard mask material on the entire topmost surface of the exemplary semiconductor structure shown in FIG. 1. The hard mask material may be composed of silicon nitride ($Si_3N_4$), silicon carbide (SiC) or SiC(N,H). The blanket layer of hard mask material may be formed by a deposition process such as, for example, chemical vapor deposition (CVD) or plasma enhanced chemical vapor deposition (PECVD). After forming the blanket layer of hard mask material, the blanket layer of hard mask material can be patterned by, for example, lithography and etching, to provide the hard mask 20 illustrated in FIG. 2.

Figure 3:
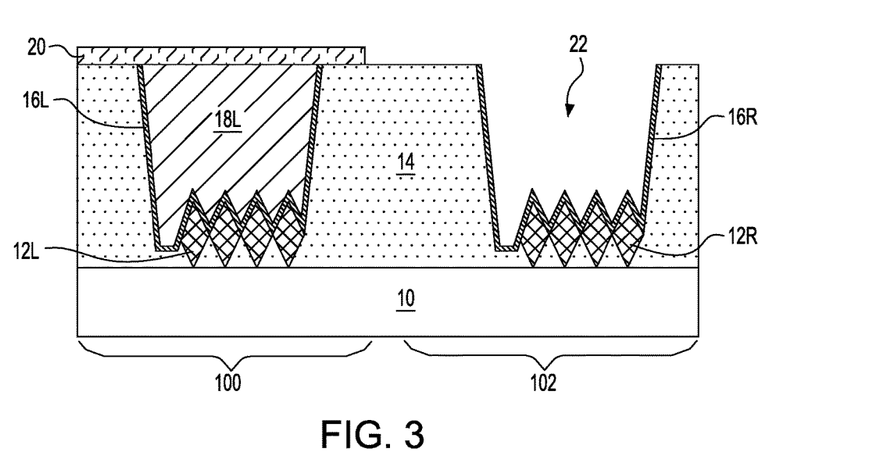
FIG. 3 is a cross sectional view of the exemplary semiconductor structure of FIG. 2 after completely removing the contact metal of the lower contact structure present in the second device region.

Referring now to FIG. 3, there is illustrated the exemplary semiconductor structure of FIG. 2 after completely removing the contact metal 18R of the lower contact structure (16R, 18R) present in the second device region 102; in this embodiment the entirety of the metal liner 16R in the second device region 102 is exposed. The metal liner 16R remains and forms a resistor structure of the present application. The contact metal 18R of the second lower contact structure (16R, 18R) can be removed utilizing an etching process. In one embodiment of the present application, a wet etch process is employed. In such an embodiment, the wet etch process may include contacting the exemplary semiconductor structure shown in FIG. 2 with a wet etchant that contains hydrofluoric acid, sulfuric acid, hydrochloric acid, nitric acid, or any combination thereof. In another embodiment, a dry etching process, such as, for example, a plasma etch may be used. In yet another embodiment, a combination of a dry etch and a wet etch may be used.

Figure 4:
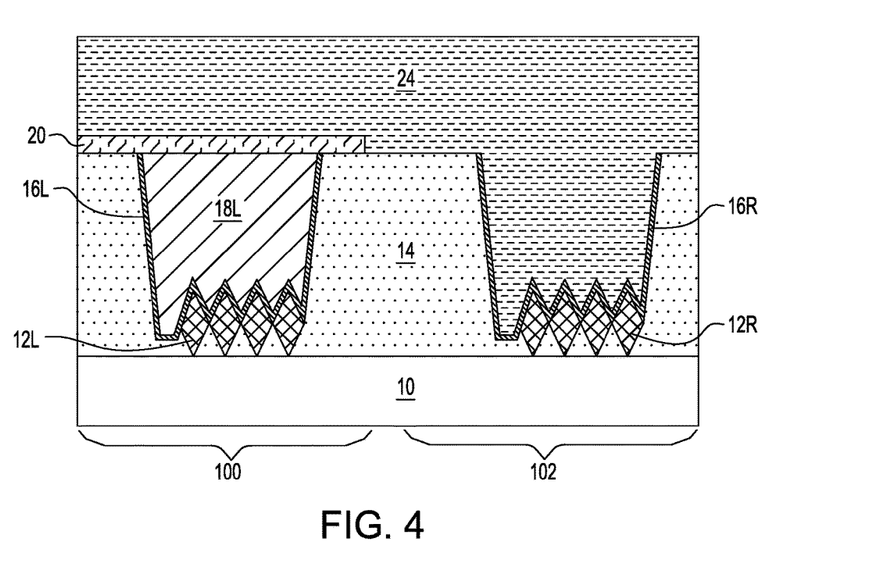
FIG. 4 is a cross sectional view of the exemplary semiconductor structure of FIG. 3 after forming a next level dielectric material in both the first and second device regions.

Referring now to FIG. 4, there is illustrated the exemplary semiconductor structure of FIG. 3 after forming a next level dielectric material 24 in both the first and second device regions (100, 102). Within the first device region 100, the next level dielectric material 24 is formed on the hard mask 20 and any exposed portion of the MOL dielectric material 14, while in the second device region 102, the next level dielectric material 24 is formed within the second contact opening and on the exposed surfaces of the metal liner 16R and any exposed portion of the MOL dielectric material 14. In the illustrated embodiment, the next level dielectric material 24 is in direct contact with the entirety of the metal liner 16R.

The next level dielectric material 24 may include one of the dielectric materials mentioned above for the MOL dielectric material 14. The dielectric material that provides the next level dielectric material 24 may be the same as, or different from, the dielectric material that provides the MOL dielectric material 14. The next level dielectric material 24 may be formed by a deposition of a dielectric material and, optionally, performing a planarization process.

Figure 5:
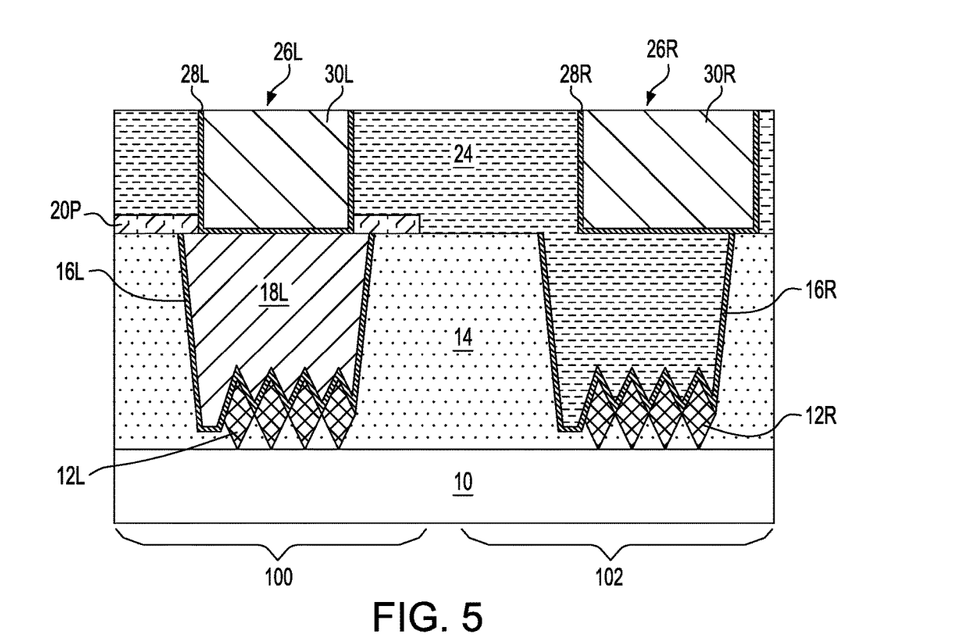
FIG. 5 is a cross sectional view of the exemplary semiconductor structure of FIG. 4 after forming an upper contact structure in an upper portion of the next level dielectric material in both the first and second device regions.
Figure 6:
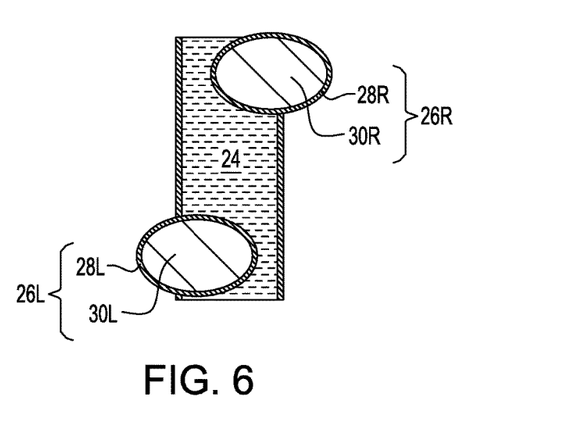
FIG. 6 is a top down view of the exemplary semiconductor structure of FIG. 5.

Referring now to FIG. 5, there is illustrated the exemplary semiconductor structure of FIG. 4 after forming an upper contact structure (26L, 26R) in an upper portion of the next level dielectric material 24 in both the first and second device regions (100, 102); FIG. 6 illustrates a top down view of the exemplary semiconductor structure of FIG. 5.

The upper contact structure 26L, which may be referred to as a first upper contact structure, is formed in the first device region 100 and contacts a topmost surface of the lower contact structure (18L, 16L), while the upper contact structure 26R, which also may be referred to as a second upper contact structure, is formed in the second device region 102 and contacts at least one of the topmost surfaces of the metal liner 16R. In the embodiment illustrated in FIG. 5, the second contact structure 26R is misaligned such that a portion of the same extends onto a portion of the topmost surface of the MOL dielectric material 14.

The first upper contact structure 26L includes a metal liner 28L and a contact metal 30L, while the second upper contact structure 26R includes a metal liner 28R and a contact metal 30R. Metal liners 28L, 28R include a metal or metal alloy mentioned above for metal liners 16L, 16R. The contact metals 30L, 30R include a metal or metal alloy mentioned above for contact metals 18L, 18R. The upper contact structures 26L, 26R may be formed by first providing contact openings into the next level dielectric material 24; in the first device region 100 the contact opening extends entirely through the hard mask 20 forming hard mask portions 20P. The contact openings can be formed by lithography and etching. A contiguous layer of a metal liner and a layer of a contact metal are then formed. A planarization process follows that removes portions of the contiguous layer of metal liner and portions of the layer of contact metal that are formed outside the contact openings formed into the next level dielectric material 24.

Figure 7:
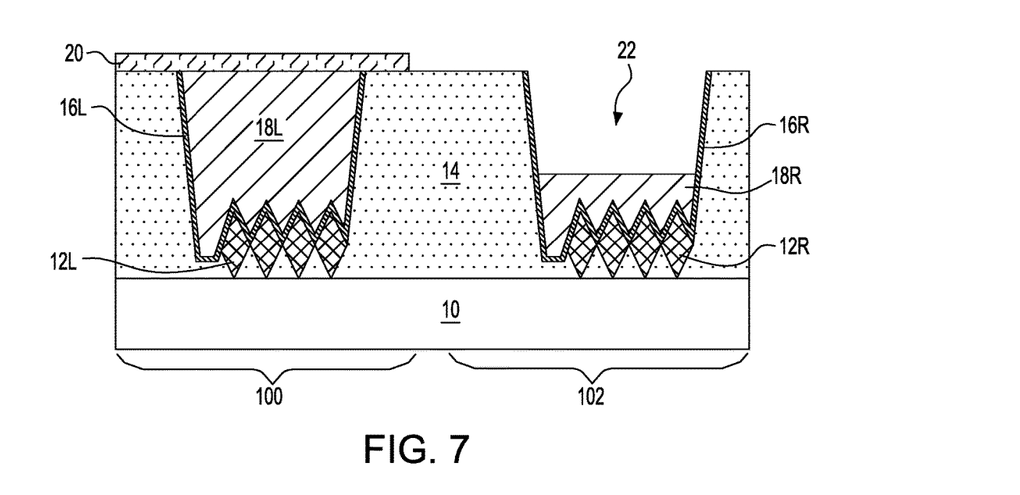
FIG. 7 is a cross sectional view of the exemplary semiconductor structure of FIG. 2 after partially removing the contact metal of the lower contact structure present in the second device region.

Referring now to FIG. 7, there is illustrated the exemplary semiconductor structure of FIG. 2 after partially removing the contact metal 18R of the lower contact structure (16R, 18R) present in the second device region 102; in this embodiment a portion of the contact metal 18R remains in a lower portion of the second contact opening that is present in the MOL dielectric material 14 in the second device region 102 and thus only a portion of the metal liner 16R is exposed. The metal liner 16R forms a resistor structure of the present application. The contact metal 18R of the lower contact structure (16R, 18R) can be partially removed utilizing an etching process. In one embodiment of the present application, a wet etch process is employed. In such an embodiment, the wet etch process may including contacting the exemplary semiconductor structure shown in FIG. 2 with a wet etchant that contains hydrofluoric acid, sulfuric acid, hydrochloric acid, nitric acid, or any combination thereof. In another embodiment, a dry etching process, such as, for example, a plasma etch may be used. In yet another embodiment, a combination of a dry etch and a wet etch may be used.

Figure 8:
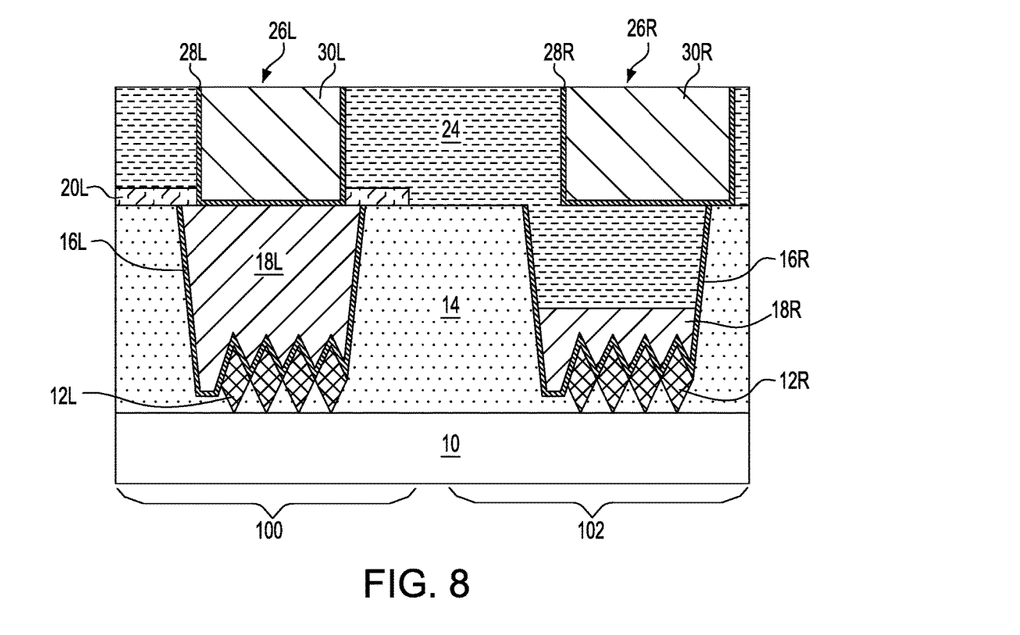
FIG. 8 is cross sectional view of the exemplary semiconductor structure shown in FIG. 7 after forming a next level dielectric material in both the first and second device regions, and then forming an upper contact structure in an upper portion of the next level dielectric material in both the first and second device regions.

Referring now to FIG. 8, there is illustrated the exemplary semiconductor structure shown in FIG. 7 after forming a next level dielectric material 24 in both the first and second device regions (100, 102), and then forming an upper contact structure (26L, 26R) in an upper portion of the next level dielectric material 24 in both the first and second device regions (100, 102). The materials and methods used in providing the same components to the structures shown in FIGS. 4 and 5 of the present application can be used in this embodiment of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

providing a substrate having a first doped semiconductor material structure present in a first device region, and a second doped semiconductor material structure present in a second device region, wherein a middle-of-the-line (MOL) dielectric material is located on the substrate and surrounds the first and second doped semiconductor material structures, and wherein the MOL dielectric material contains a lower contact structure containing a metal liner and a contact metal present in both the first and second device regions;

forming a hard mask in the first device region and atop the MOL dielectric material and the lower contact structure, while leaving the second device region physically exposed;

removing at least a portion of the contact metal of the lower contact structure present in the second device region to physically expose at least a portion of the metal liner; and forming a next level dielectric material located above the lower contact structure present in the first device region and between and above the metal liner present in the second device region, wherein the next level dielectric material contains an upper contact structure in both of the first and second device regions.

2. The method of claim 1, wherein the contact metal is completely removed in the second device region.

3. The method of claim 1, wherein the contact metal is partially removed and wherein a remaining portion of the contact metal remains in a lower portion of a contact opening formed in the MOL dielectric material.

4. The method of claim 1, wherein the metal liner comprises a metal or metal alloy having a higher resistivity than a metal or metal alloy that provides the contact metal of each of the lower contact structures.

5. The method of claim 1, wherein each of the first and second doped semiconductor material structures contains a plurality of diamond shaped doped semiconductor materials.

6. The method of claim 5, wherein the plurality of diamond shaped doped semiconductor materials in the first device regions are merged, and wherein the plurality of diamond shaped doped semiconductor materials in the second device region are merged.

7. The method of claim 1, wherein the removing at least the portion of the contact metal of the lower contact structure present in the second device region comprising a wet etch process.

8. The method of claim 7, wherein the wet etch process comprises a wet etchant containing hydrofluoric acid, sulfuric acid, hydrochloric acid, nitric acid, or any combination thereof.

9. The method of claim 1, wherein the forming the next level dielectric material comprises:

depositing a dielectric material in the first and second device regions, wherein a portion of the dielectric material in the second device region directly contacts an exposed surface of the metal liner;

forming a contact opening in the dielectric material and in each of the first and second device regions; and forming the upper contact structure in each of the contact openings provided in the dielectric material.

10. The method of claim 9, wherein a portion of the next level dielectric material directly contacts an exposed surface of the metal liner in the second device region.

11. The method of claim 1, wherein the physically exposed portion of the metal liner provides a resistor in the second device region.

12. The method of claim 11, wherein one of the upper contact structures contacts the resistor and another of the upper contact structures contacts the lower contact structure in the first device region.

13. The method of claim 11, wherein the resistor comprises a metal or metal alloy having a higher resistivity than a metal or metal alloy that provides the contact metal of each of the lower contact structures.

14. The method of claim 1, wherein the substrate is composed of an insulator material of a semiconductor-on-insulator substrate.

15. The method of claim 1, wherein the substrate is a semiconductor material portion of a bulk semiconductor substrate.

16. The method of claim 1, wherein each of the first doped semiconductor material structure and second doped semiconductor material structure is formed on a surface of a semiconductor fin.

17. The method of claim 16, wherein each of the first doped semiconductor material structure and second doped semiconductor material structure is formed by an epitaxial growth process.

18. The method of claim 4, wherein the metal liner is composed of titanium nitride (TiN), titanium (Ti), tantalum nitride (TaN), tantalum (Ta), tungsten (W), or tungsten nitride (WN), and the contact metal is composed of tungsten (W), cobalt (Co), aluminum (Al), copper (Cu) or any alloy thereof.

* * * * *